United States Patent [19]

Burns et al.

[11] Patent Number: 5,482,793

[45] Date of Patent: Jan. 9, 1996

[54] ASSEMBLY HAVING IMPROVED THERMAL SENSING CAPABILITY

[75] Inventors: Arthur G. Burns; Jose M. Fernandez; Robert D. Kreisinger, all of Plantation, Fla.

[73] Assignee: Motorola, Inc., Schaumburg, Ill.

[21] Appl. No.: 131,234

[22] Filed: Oct. 4, 1993

[51] Int. Cl.$^6$ ............................................ H01M 10/50
[52] U.S. Cl. .................................. 429/62; 429/90; 320/35
[58] Field of Search ............................. 429/8, 61, 62, 429/90, 120; 320/35

[56] References Cited

U.S. PATENT DOCUMENTS

| | | | |
|---|---|---|---|
| 4,572,878 | 2/1986 | Daugherty | 429/62 |
| 4,702,563 | 10/1987 | Parker | 429/90 X |
| 4,727,006 | 2/1988 | Malinowski et al. | 429/62 X |
| 4,999,576 | 3/1991 | Levinson | 429/62 X |
| 5,091,272 | 2/1992 | Treger | 429/62 |
| 5,290,643 | 3/1994 | Chen | 429/61 |

*Primary Examiner*—Anthony Skapars
*Attorney, Agent, or Firm*—Pedro P. Hernandez; Kenneth M. Massaroni

[57] ABSTRACT

A battery assembly (200) includes first and second battery housings (202 and 204), a plurality of battery cells (204), and a flexible circuit having a thermal sensing surface (206) which is located in thermal proximity to battery cells (204). The thermal sensing surface (206) is in thermal proximity to the plurality of battery cells (204) providing for improved thermal sensing of battery assembly (200).

2 Claims, 4 Drawing Sheets

ASSEMBLY HAVING IMPROVED THERMAL SENSING CAPABILITY

TECHNICAL FIELD

This invention relates in general to electronic assemblies, and more specifically to a heat generating assembly such as a battery assembly which provides for improved thermal sensing.

BACKGROUND

Referring to FIG. 1, there is shown a schematic block diagram of a radio assembly 100. Radio assembly 100 includes a conventional radio 104 such as a two-way frequency-modulated (FM) radio. Radio 104 is coupled to a battery pack or battery assembly 106 via B+line 116 and B− or ground potential line 114. In a typical design, battery assembly 106 is mechanically connected to radio 104. Electrical contacts on radio 104 and battery assembly 106 provided for the electrical interconnection of radio 104 to battery assembly 106, once battery assembly 106 is connected to radio 104.

Battery assembly 106 includes a plurality of battery cells 108 coupled in series. Battery cells 108 are typically rechargeable and can be of many different varieties such as Nickel-Cadmium, Nickel-Metal-Hydride, etc. Battery cells 108 can also be packaged in a number of different geometry's, such as by using cylindrical cells, prismatic cells, etc. Battery assembly 106 as shown also includes a capacity resistor (Rc) 106 as known in the art which informs an external battery charger 102, charging battery assembly 106, the charge capacity of assembly 106 (i.e., a particular resistance value could inform the charger that it is charging a 1000 milli-ampere-hour (mall) capacity battery). Capacity resistor 110 helps the external charger determine the amount of charge current to provide battery assembly 106. A thermistor (Rt) 112 is also utilized in the assembly in order to track the temperature of battery assembly 106 when it is being charged. A set of battery contacts 120, 122, 124 and 126 provide for electrical interconnection to external battery charger 102 whenever battery assembly 106 requires charging. Finally, a protection diode 118 is also included for blocking any current from flowing from battery cells 108 into the external charger.

Charger 102 consists of a charger monitor circuit 128, which can consist of a well known microprocessor or microcontroller as known in the art and appropriate control software. Charger monitor circuit 128 controls charger control circuit 130 which provides current to battery 106 in order to charge the battery. A control signal is transmitted by charger monitor circuit 128 to charger control circuit 130 via bus 140, the control signal informs charger control circuit 130 on how much current to source via line 129 to battery 106.

Charger monitor circuit 128 contains three analog to digital (A/D) ports 132, 134 and 136. A/D port 132 monitors the voltage on the B+line. A/D port 134 senses the resistance of capacity resistor Rc 110 and A/D port 136 in turn senses the resistance of thermistor Rt 112, as its resistance changes once the battery begins charging. A/D ports 134 and 136 include external pull-up resistors which are used to determine the resistance's of Rc 110 and Rt 112 indirectly, by determining the voltage level at A/D ports 134 and 136, respectively. The voltage level at ports 134 and 136 change with changes in capacity resistor 110 and thermistor 112 respectively.

Typically, the discrete components (e.g., thermistor 112, diode, 118 and capacity resistor 110, etc.)of battery assembly 106 are interconnected to each other using a flexible circuit board as known in the art. The flexible circuit will also help in the interconnection of battery cells 108. Thermistor 112 is typically electrically soldered to the flexible circuit and the flexible circuit is then placed in close proximity to battery cells 108 which help form battery assembly 106. With the move in the electronics industry of providing even smaller assemblies, newer surface mount thermistors are beginning to be employed in the manufacture of battery assemblies and other heat producing assemblies.

A major problem arises when using present day thermistors because of their small size, one finds that the temperature measurement capability of thermistors when employed in heat producing assemblies to measure temperature changes, is confined to the sensing of temperature changes in a small area, or "spot", of the overall assembly. This is especially true in battery assemblies where the change in temperature of the battery cells rise quickly due to the rapid charging of the battery cells. For example, referring to FIG. 2, a top view of a prior art battery assembly 200 is shown. Battery assembly 200 includes a battery housing 204 and a plurality of cylindrically shaped battery cells 202. Battery cells 202 are electrically interconnected to each other in series, with the positive terminal of the battery group connected to contact 208 located on flexible circuit 212, while the negative terminal of the battery group is coupled to contact 210. A thermistor 206 is provided on flexible circuit 212, but as can be seen, it is in thermal proximity to only one of the battery cells 202. This causes thermistor 206 to only accurately sense changes in temperature of the battery cell it is closest to.

When using prismatic cell geometries, this spot temperature sensing problem becomes even more pronounced, due to the large surface area of prismatic cell packages. In the event that the battery cell which the thermistor is closest to is damaged, and is no longer taking on charge, the thermistor will be informing the battery charger that the battery assembly is at a normal temperature, when in fact the other battery cells may be overheating. A need thus exists for providing an improvement in the thermal sensing of electronic assemblies such as battery assemblies.

SUMMARY OF THE INVENTION

Briefly, according to the invention, a heat producing assembly such as a battery assembly providing for improved thermal sensing includes a thermal sensing surface. In one aspect of the invention the thermal sensing surface is formed on one layer of a flexible circuit board which is located in thermal proximity to a plurality of battery cells. The thermal sensing surface having a thermal sensing trace which changes in resistance with changes in the temperature of the plurality og battery cells.

DETAILED DESCRIPTION OF THE PREFERRED EMBODIMENT

Figure 1:
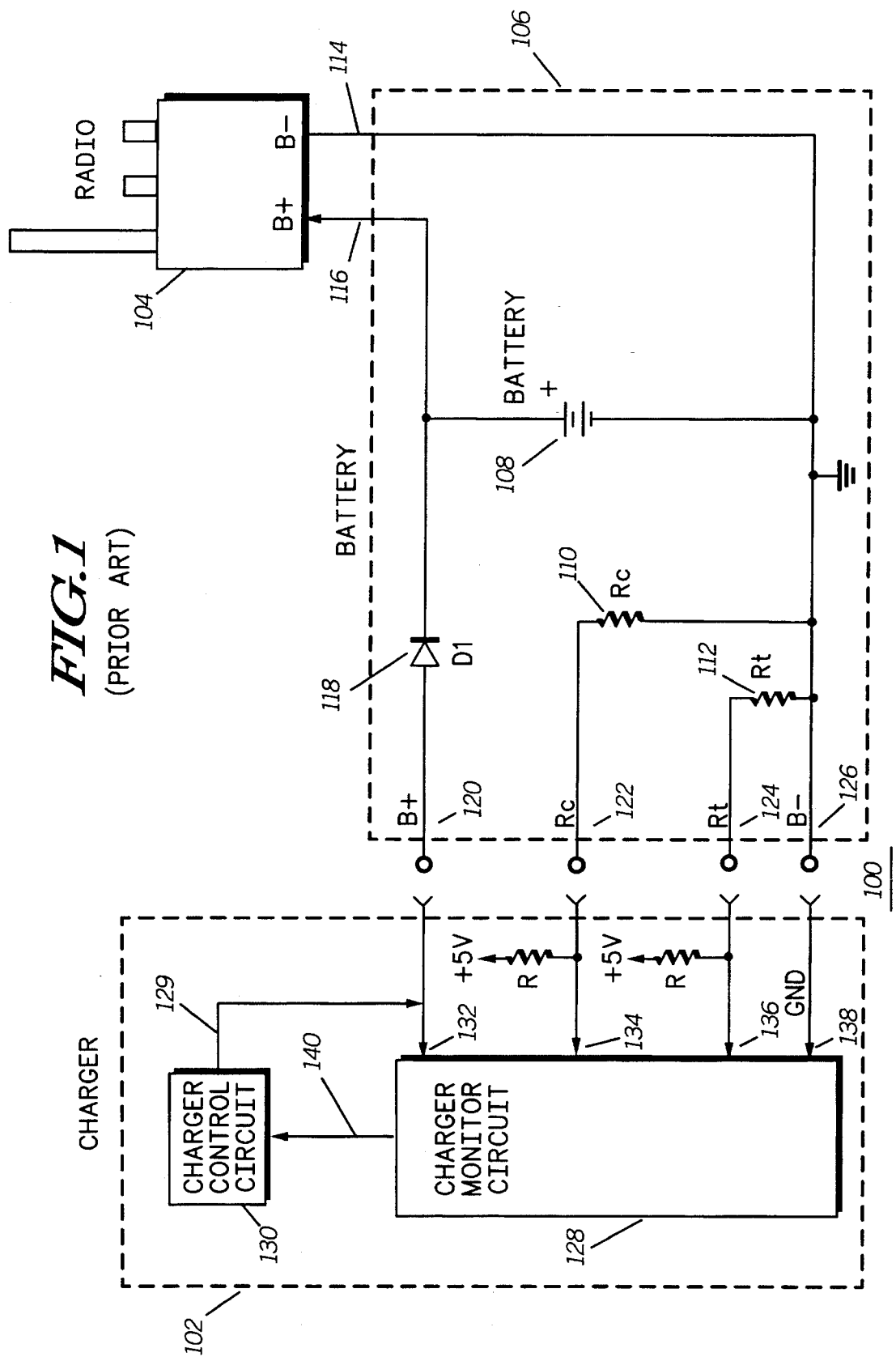
FIG. 1 is a prior art schematic of a radio and battery assembly.
Figure 2:
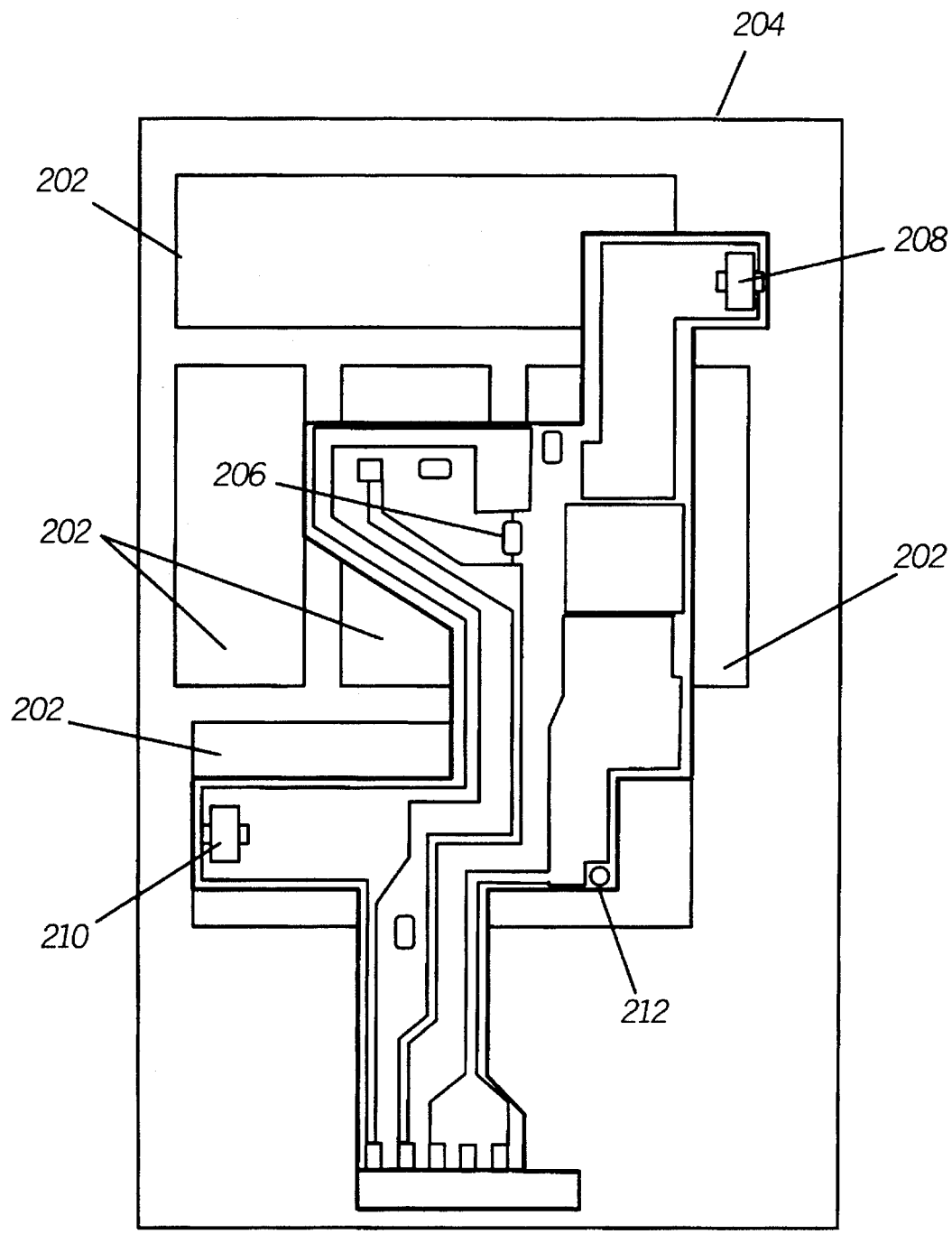
FIG. 2 is a top view of a section of a prior art battery assembly is shown.

While the specification concludes with claims defining the features of the invention that are regarded as novel, it is believed that the invention will be better understood from a consideration of the following description in conjunction with the drawing figures, in which like reference numerals are carried forward.

Figure 3:
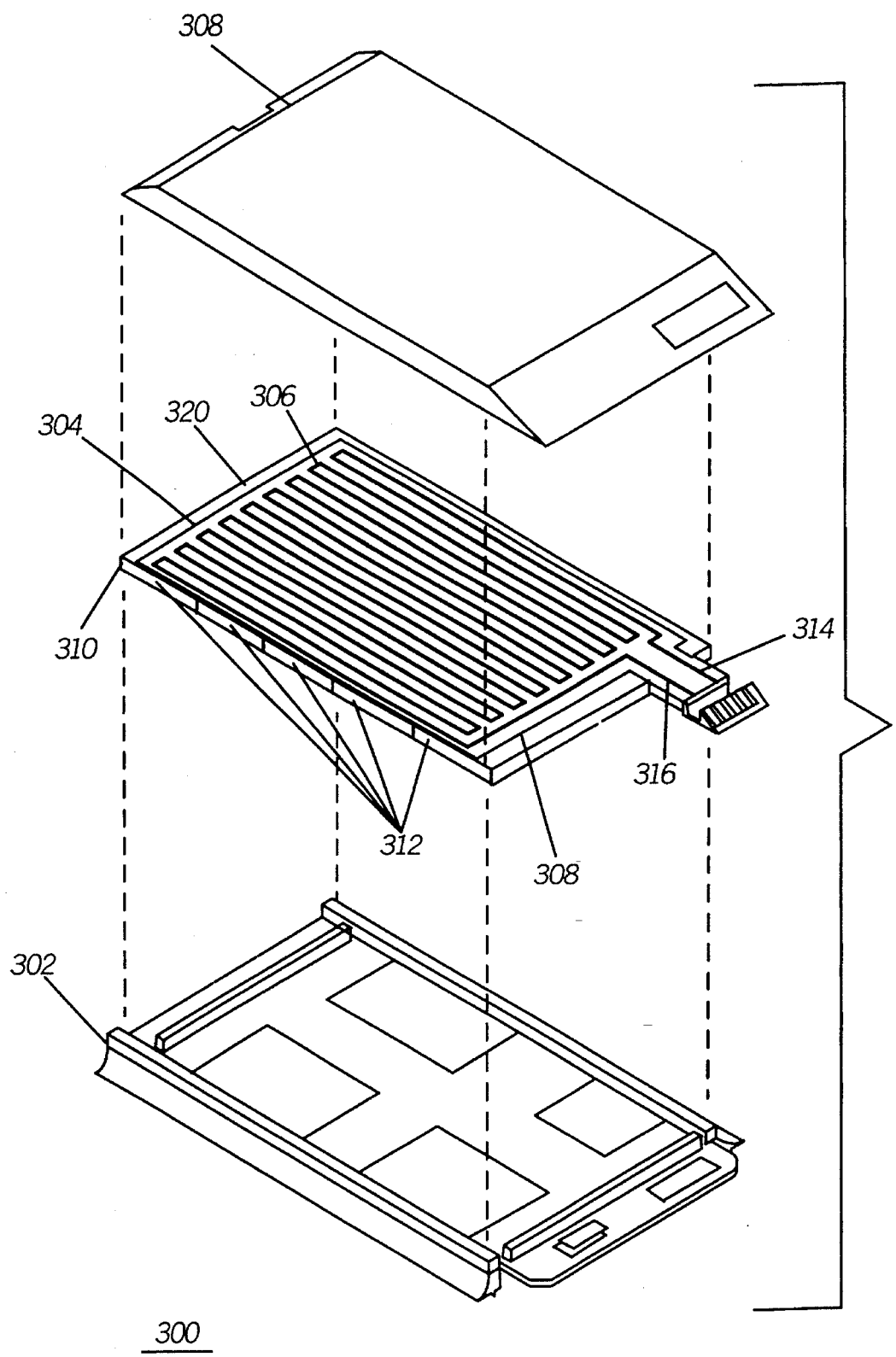
FIG. 3 shows an exploded view of a battery assembly in accordance with the present invention.

Referring now to FIG. 3, a battery assembly 300 in accordance with the invention is shown. Battery assembly 300 includes first 302 and second 308 battery housings. Located inside of battery housings 302 and 308 is a plurality of battery cells 310. In battery assembly 300, battery package 310 is shown as a group of prismatic battery cells 312 which are electrically interconnected in order to provide for a substantially flat battery package. Located close to battery cells is a thermal sensing means in accordance with the present invention. The thermal sensing means is preferably formed by forming a serpentine trace (runner) 306 or any of a number of designs on one layer of a flexible circuit board 304 in order to form a thermal sensing surface 308. Preferably, the design of trace 306 on circuit board 304 has a long trace length to area geometry such as found in serpentine or other designs having many curves. This long trace length to area geometry of trace 306 allows for more thermal sensing area to be available in order to detect changes in temperature in battery package 310. Trace 306 is electrically conductive and includes two end terminals 314 and 316. Thermal sensing surface 308 is in thermal proximity to battery cells 306. Temperature sensing trace 306 should preferably be no further than 0.0127 centimeters from surface 320 of battery package 320. In the preferred embodiment lower surface 308 of circuit board 304 is physically touching surface 320. Another set of layers of the flexible circuit board 304 (not shown in order to highlight the design of the thermal sensing surface) would include the other discrete components used in battery assembly 300 as shown in FIG. 1. For example, a capacity resistor, blocking diode, intrinsic safe current limiting elements, etc. could be included in extra layers of the flexible circuit board 304.

Serpentine trace or design 306 is preferably formed from copper which is etched onto flexible circuit board 304 to form a conductive trace or runner. Preferably, serpentine trace 306 is located between two layers of flexible material such as polyimide or other well known materials used in forming flexible circuit boards. Each of the polyimide layers forming circuit board 304 are preferably 0.0038 centimeters in thickness. In the preferred embodiment, serpentine trace 306 is located between two sheets of KAPTON®, a polyimide manufactured by Dupont, Inc. Although copper is preferably used to form the temperature sensing design element for temperature sensing circuit 304, other types of materials having high temperature coefficients of resistivity can also be utilized, such as nickel, chromium and alloys thereof. Since copper trace 306 covers most of the surface of thermal sensing surface 308, which in turn covers a substantial portion of battery package surface 320, a better temperature reading can be had of the plurality of battery cells 312. Copper has a temperature coefficient of resistivity of 0.0039 which provides for a good change in resistance over small changes in temperature. By monitoring the resistance of copper trace 306, which is in close proximity to many, if not all of the battery cells 312, a better temperature monitoring element for battery charge control can be provided to the battery charger.

Copper trace 306 acts as a better temperature sensor then by using a thermistor, since trace 306 can provide for the averaging of temperatures of all battery cells 312, unlike a discrete thermistor which provides for only a "spot" temperature change determination over a short period of time. A second benefit of the present invention is that there is no need for a component (i.e., thermistor) on the flexible circuit to sense the temperature of the battery cells, thus reducing the parts counts and minimizing unreliable component connections (e.g., solder joints). By providing the temperature sensing trace on a flexible circuit board, a conformable temperature sensing surface can be provided which can wrap around cells to provide good temperature sensing. For example, in the case of cylindrical battery cells, the flexible substrate having the temperature sensing trace could be wrapped around the battery cell(s).

Although the temperature sensing trace in the preferred embodiment is formed from copper due to its low cost, other materials such as nickel with its higher thermal coefficient of resistivity plus its superior chemical resistance to cell electrolytes can provide for even better temperature sensing capability at a slightly higher cost. Besides the use of different temperature sensing materials (e.g., cooper, nickel, etc.), the forming of the materials actual resistance path can be formed in many different ways and shapes. For example, temperature sensing trace can be formed using many different manufacturing techniques such as by silk screening, vapor deposition, etching, etc. The geometry of temperature sensing trace 306 can also be modified to better conform to the battery cell package being designed and is not limited to a serpentine design as illustrated. For example, the geometry can be any design such as a spiral, or any other of many designs which can provide for wide surface coverage.

Another alternative to the assembly shown in FIG. 3 would be to form copper trace 306 on battery housing 308 using well known manufacturing techniques. Such as the etching of copper on plastic housing 308. This approach would eliminate the need of using a flexible circuit carrier for the purpose of sensing for battery temperature changes. However, since most battery assemblies use flexible circuits for carrying short-circuit protection devices such as fuses or thermal links, battery capacity resistors and for the interconnection of the battery cells, it would in most cases be more cost effective to provide trace 306 on a flexible circuit board.

The monitoring for changes in temperature using the present invention are similar to that used in FIG. 1. Preferably, one end terminal, for example terminal 316 of the temperature sensing circuit would be set at ground potential, and the other terminal 314 would be connected to one end of a pull-up resistor and the other end of the resistor would be connected to a known voltage potential. Terminal 314 would then be connected to an A/D port of a microprocessor, or other equivalent hardware circuit which can monitor for changes in resistance in trace 306. The microprocessor would then monitor the A/D port for changes in the resistance of trace 306 by monitoring for changes in voltage at the A/D port, similar to the way shown in FIG. 1.

The ability of the present invention to conform to the battery cells undergoing thermal monitoring can be particularly beneficial with future battery assemblies such as lithium solid state cells which are themselves conformable. The present invention can also combine the thermal sensing trace 306 with the battery housing by etching or two-shot molding battery housing 302. This would do away with the flexible substrate and provide the temperature sensing trace on the battery housing, thereby reducing part count in the assembly. Also, with the present invention, one could wrap a substantial portion of the battery cell package 310 with the thermal sensing circuit since it is flexible and can easily be conformed to different shapes.

Figure 4:
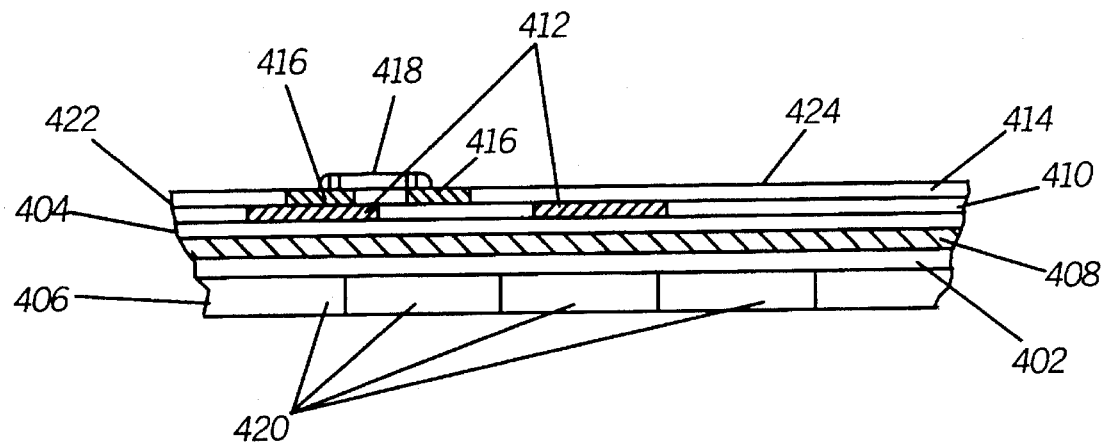
FIG. 4 is a partial cross-sectional view of a flexible circuit assembly in accordance with the invention.

In FIG. 4, a partial cross-sectional view of a battery assembly 400 in accordance with the invention is shown. Assembly 400 includes a multilayer flexible circuit board 422 which includes first 402 and second 404 insulation layers of polyimide. Located between layers 402 and 404 is a thermal sensing trace 408 in accordance with the invention. Surface 406 of the multilayer flexible circuit is shown placed against the walls of battery cells 420. Trace 408 is thereby close enough to battery cells 420 in order to sense any changes in temperature in any of the battery cells 420. A change in temperature in any of the battery cells 420 translates into a change in resistance in trace 408.

Multilayer board 422 further includes several other layers 404, 410 and 414. Layer 412 includes other electrical traces for interconnecting battery cells 420 and components such as capacity resistor 418. Electrical vias 412 provided for electrical interconnection between traces 412 and components and traces located on surface 424.

Figure 5:
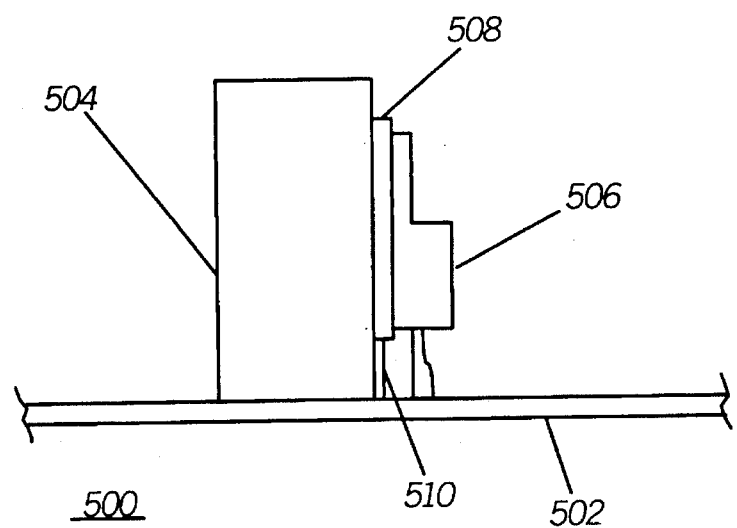
FIG. 5 is another embodiment of the present invention.

Referring now to FIG. 5, another embodiment of the present invention is shown. FIG. 5 shows a power transistor assembly 500 which includes a thermal sensing means 508 such as a flexible circuit having a thermal sensing trace as described above. Thermal sensing circuit 508 is located between power transistor 506 and heat sink 504. Thermal sensing circuit 508 in this embodiment not only provides thermal monitoring of transistor 506 but also helps insulate transistor 506 from heat sink 504. The temperature monitor leads 510 of thermal sensor 508 are electrically coupled via printed circuit board 502 to a controller such as a microprocessor which can monitor the changes in resistance of circuit 508 which translate in changes in temperature of transistor 506. The controller can then adjust the operation of transistor 506 in the case that the temperature of the assembly reaches a critical temperature.

In summary, the present invention provides for improved thermal monitoring of battery assemblies as compared to present techniques, such as by using thermistors, thermocouples, thermostats, etc. By monitoring the resistance of a known material knowing the temperature coefficient of the material, and placing the material over a wide area of the heat generating source (e.g., battery package, etc.) to be monitored, a better average temperature rise measurement of the device can be had as compared to the use of discrete thermistors or termo-sensors. In using a flexible assembly as described in the preferred embodiment, the thermal sensing trace can be conformed to the geometry of the heat generating device (e.g., battery). While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A battery assembly, comprising:

a battery having a major surface; and a battery housing which supports the battery, the battery housing having a temperature sensing trace located in thermal proximity to the major surface of the battery, said temperature sensing trace being etched onto the battery housing.

2. A battery assembly as defined in claim 1, wherein the temperature sensing trace covers a substantial portion of the major surface of the battery.

* * * * *